United States Patent [19]

Papae et al.

[11] Patent Number: 5,132,613
[45] Date of Patent: Jul. 21, 1992

[54] LOW INDUCTANCE SIDE MOUNT DECOUPLING TEST STRUCTURE

[75] Inventors: Donald J. Papae, Hopewell Junction; Donald F. Schomaker; Michael A. Sorna, both of Poughkeepsie, all of N.Y.

[73] Assignee: International Business Machines Corporation, Armonk, N.Y.

[21] Appl. No.: 620,973

[22] Filed: Nov. 30, 1990

[51] Int. Cl.$^5$ .............. G01R 31/02; G01R 31/28; H05K 1/00

[52] U.S. Cl. .............. 324/158 F; 324/73.1; 361/414

[58] Field of Search ............. 324/158 R, 158 F, 73.1; 361/212, 306 DC, 414; 357/71

[56] References Cited

U.S. PATENT DOCUMENTS

| | | |
|---|---|---|
| 4,221,047 | 9/1980 | Narken et al. |
| 4,288,841 | 9/1981 | Gogal |
| 4,322,778 | 3/1982 | Barbour et al. ............. 361/212 |
| 4,328,530 | 5/1982 | Bajorek et al. |
| 4,349,862 | 9/1982 | Bajorek et al. |
| 4,551,747 | 11/1985 | Gilbert et al. ............. 361/414 |
| 4,577,214 | 3/1986 | Schaper |
| 4,654,694 | 3/1987 | Val |
| 4,725,878 | 2/1988 | Miyauchi et al. |
| 4,827,327 | 5/1989 | Miyauchi et al. |
| 4,875,087 | 10/1989 | Miyauchi et al. |
| 4,879,588 | 11/1989 | Ohtsuka et al. |
| 4,896,464 | 1/1990 | Kim et al. |
| 4,922,324 | 5/1990 | Sudo |
| 4,978,914 | 12/1990 | Akimoto et al. ............. 324/158 F |

*Primary Examiner*—Ernest F. Karlsen
*Attorney, Agent, or Firm*—Harry F. Smith; Donald M. Boles

[57] ABSTRACT

An integrated circuit test structure is comprised of a stacked substrate MLC space transformer (5). A top surface of an interface substrate (12) is employed for decoupling capacitor (36) placement. The top surface has metal conductors (20) exposed thereon for terminating power supply buses from a tester (1). Individual layers of a personalization substrate (14) are fabricated to redundantly extend internal power plane metalization (22) to the sidewalls. Redundant pads (26) are placed on each personalization layer to increase the surface area for side mount contact. Metal pads (18) are deposited over the exposed sidewall metal for forming a sidewall contact to the power planes within the personalization substrate. The personalization substrate is joined to the upper surface of the interface substrate and the sidewall contacts are conductively coupled by conductive members (40) to the interface substrate metal conductors (20), thereby providing a low inductance, low resistance DC path from the tester to a device under test (4). The decoupling capacitors are electrically coupled to the metal lines in close proximity the personalization substrate thereby minimizing the associated lead inductance and maximizing the effectiveness of the decoupling capacitors.

20 Claims, 3 Drawing Sheets

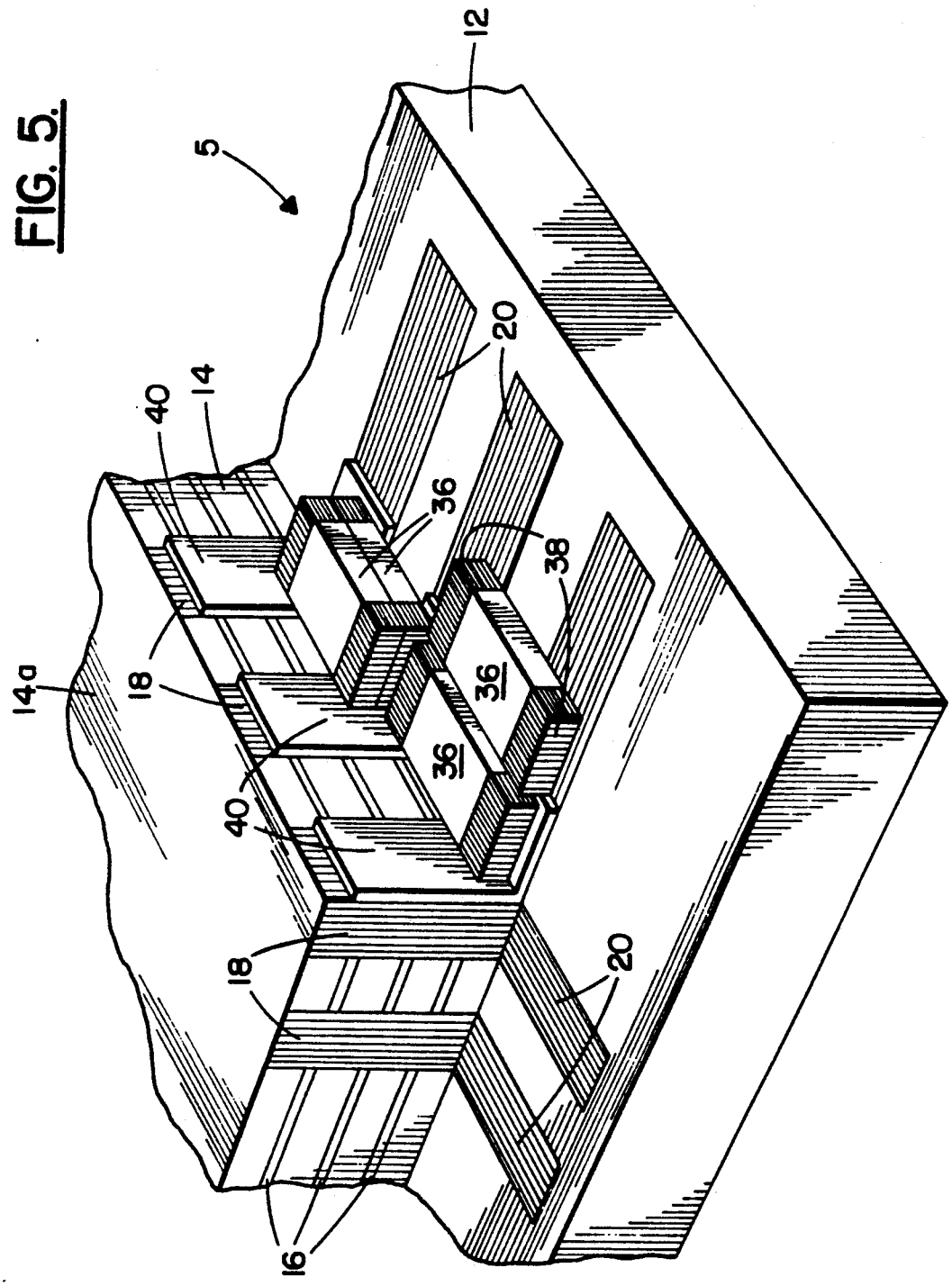

LOW INDUCTANCE SIDE MOUNT DECOUPLING TEST STRUCTURE

FIELD OF THE INVENTION

This invention relates generally to integrated circuit test systems and, in particular, to a low inductance integrated circuit test structure.

BACKGROUND OF THE INVENTION

During the final test of bipolar integrated circuits, or chips, test systems may operate with electrical signals having rise times as fast as 0.4 ns/V. During a wafer level test, multiple outputs of a Device Under Test (DUT) are typically caused to switch simultaneously. This switching generates abrupt changes in the DUT power supply voltage rails, causing the DUT logic gates to erroneously change state. The erroneous change of state results from what is known as a "Delta-I problem". The Delta-I problem occurs because the test system power supply cannot supply the transient switching currents required by the DUT.

Delta-I is considered, for the purposes described herein, to be a change in test system power supply current, both amplitude and slew rate, as a function of a change in a logical state of the DUT.

Power supply decoupling, in the form of capacitors, is a well known technique that is employed to augment the DUT transient power requirements and serves primarily to reduce fluctuations in the voltage applied to the DUT. The overall effectiveness of capacitive decoupling is inversely proportional to the magnitude of the inductance between the decoupling capacitors and the DUT. The larger the magnitude of the inductance, the more pronounced the Delta-I problem becomes because the current through the inductance associated with the power supply lines cannot change instantaneously. The inductance therefore tends to inhibit the required change in current, thus resulting in a transient drop in DUT power supply voltage. As a result, effective DUT power supply capacitive decoupling requires low inductance paths from the power supply and/or decoupling capacitors to the DUT.

It can thus be appreciated that a technique is required for routing power to the DUT such that a significant amount of inductance is not added to the DUT power buses. What is also required is a technique for routing power to a DUT that enables an optimum physical placement of the decoupling capacitors relative to the DUT, while not adversely impacting signal I/0 routing between the DUT and the tester.

In U.S. Pat. No. 4,922,324, May 1, 1990, entitled "Semiconductor Integrated Circuit Device" Sudo discloses decoupling capacitors mounted on metal patterns within a package chip cavity, the metal patterns being connected to sides of the package.

In U.S. Pat. No. 4,879,588, Nov. 7, 1989, entitled "Integrated Circuit Package" Ohtsuka et al. disclose power supply and ground wiring on a periphery of a Multilayer Ceramic (MLC) integrated circuit package.

In U.S. Pat. No. 4,875,087, Oct. 17, 1989, entitled "Integrated Circuit Device Having Strip Line Structure Therein" Miyauchi et al. disclose the use of capacitors in an insulating layer with reduced cross-section conductors to make triplate strip line impedance match a microstrip line impedance.

In U.S. Pat. No. 4,827,327, May 2, 1989, entitled "Integrated Circuit Device Having Stacked Conductive Layers Connecting Circuit Elements Therethrough" Miyauchi et al. disclose high speed connections on a side of package for obtaining a lowered inductance.

In U.S. Pat. No. 4,725,878, Feb. 16, 1988 entitled "Semiconductor Device" Miyauchi et al. disclose GND, power and signal connections on a side of a package. Ground potential lines surround high speed signal lines to form a pseudo-stripline. Impedance is said to be controlled by running the lines on the side of package as opposed to going through internal vias.

In U.S. Pat. No. 4,654,694, Mar. 31, 1987, entitled "Electronic Component Box Supplied with a Capacitor" Val discloses side connections to place a capacitor in close proximity to a chip or, alternatively, to a chip and GND/Power I/0.

In U.S. Pat. No. 4,577,214, Mar. 18, 1986, entitled "Low-Inductance Power/Ground Distribution in a Package for a Semiconductor Chip" Schaper discloses a chip package having a chip cavity and power and ground planes which, together with insulation, form capacitors.

In U.S. Pat. No. 4,288,841, Sept. 8, 1981, entitled "Double Cavity Semiconductor Chip Carrier" Gogal discloses a double chip carrier having power/voltage planes connected to edge castellations.

What is not taught by this prior art, and what is thus one object of the invention to provide, is an improved integrated circuit test structure for routing power to a DVT while not adding a significant amount of inductance and, thus, reducing the effectiveness of power supply decoupling capacitors.

A further object of the invention is to provide an improved integrated circuit test structure that enables an optimum physical and electrical placement of decoupling capacitors, relative to the DUT, for minimizing power conductor inductance and also for minimizing interference with signal I/0 routing between the DUT and a test system.

SUMMARY OF THE INVENTION

The foregoing and other problems are overcome and the objects of the invention are realized by an integrated circuit test structure that minimizes power supply inductance. In a presently preferred embodiment the test structure is comprised of a stacked substrate MLC space transformer (SX). A top surface of a SX interface substrate is employed for decoupling capacitor placement. This top surface has metal conductors exposed thereon for terminating power supply buses from the tester. Individual layers of a SX personalization substrate are fabricated to redundantly extend internal power plane metalization to side edges of the layers. Also, redundant pads are placed on each personalization layer to increase the surface area of the side mount contact. After lamination and sintering a final cutting of the personalization substrate exposes the metalization along sidewalls of the personalization substrate. Thick film metal pads are deposited over the exposed sidewall metal for forming a sidewall contact to the power planes within the personalization substrate. The personalization substrate is joined to the upper surface of the interface substrate and the sidewall contacts are conductively coupled to the interface substrate metal conductors, thereby providing a low inductance, low resistance DC path from the tester power supply to the personalization power planes. Decoupling capacitors are electrically coupled to the metal lines exposed upon the upper surface of the interface substrate in close proximity to the personalization substrate and to the DUT which, during use, is disposed upon a top surface of the personalization substrate. Via inductance, a significant contributor to inductance in other test structures, is thus minimized by connecting through the sidewalls directly to the voltage distribution planes within the personalization substrate.

Thus, in accordance with the invention there is provided apparatus for coupling at least operating power to an integrated circuit device during a test of the device. The apparatus includes terminals for connecting operating power to electrical contacts disposed upon a first surface of a first MLC substrate and vias for routing the operating power up through the first MLC substrate to a plurality of first electrical conductors disposed upon a second surface of the first MLC substrate. The apparatus also includes conductors for coupling the operating power from the first electrical conductors to a plurality of power distribution planes disposed within a second MLC substrate that is mounted upon the second surface of the first MLC substrate. The couplers include structure for contacting edges of the power distribution planes that are exposed in cross-section upon sidewalls of the second MLC substrate. The apparatus further includes further vias for routing the operating power up through the second MLC substrate to a plurality of second electrical conductors disposed upon a second surface of the second MLC substrate. The second electrical conductors are coupled, during use, to electrical power terminals on the integrated circuit device under test.

Further in accordance with the invention the apparatus provides capacitors for decoupling electrical transients occurring in the operating power, the capacitors being disposed substantially adjacent to the sidewalls of the second MLC substrate.

The invention also teaches a method of coupling operating power to an integrated circuit device during a test of the device. The method includes the steps of (a) connecting operating power to electrical contacts disposed upon a first surface of a first MLC substrate; (b) routing the operating power up through the first MLC substrate to a a plurality of first electrical conductors disposed upon a second surface of the first MLC substrate; and (c) coupling the operating power from the first electrical conductors to a plurality of power distribution planes disposed within a second MLC substrate that is mounted upon the second surface of the first MLC substrate. The step of coupling includes a step of contacting edges of the power distribution planes that are exposed in cross-section upon sidewalls of the second MLC substrate. The method includes an additional step of routing the operating power up through the second MLC substrate to a plurality of second electrical conductors disposed upon a second surface of the second MLC substrate. The second electrical conductors are coupled, during use, to electrical power terminals on the integrated circuit device being tested.

A further step of the method decouples electrical transients occurring in the operating power, the step of decoupling occurring substantially adjacent to the sidewalls of the second MLC substrate.

BRIEF DESCRIPTION OF THE DRAWING

The above set forth and other features of the invention are made more apparent in the ensuing Detailed Description of the Invention when read in conjunction with the attached Drawing, wherein:

FIG. 5 is an elevational view showing in greater detail the coupling of the personalization substrate to an interface substrate and an optimum placement of stacked decoupling capacitors.

DETAILED DESCRIPTION OF THE INVENTION

A presently preferred test structure utilized to distribute both DUT power and DUT input/output signals (I/O's) employs Multi-layer Ceramic (MLC) substrates. The MLC substrate, in combination with other components, is referred to herein as a Space Transformer (SX). One especially suitable technique for implementing the MLC SX is referred to herein as a stacked substrate SX.

Figure 1:
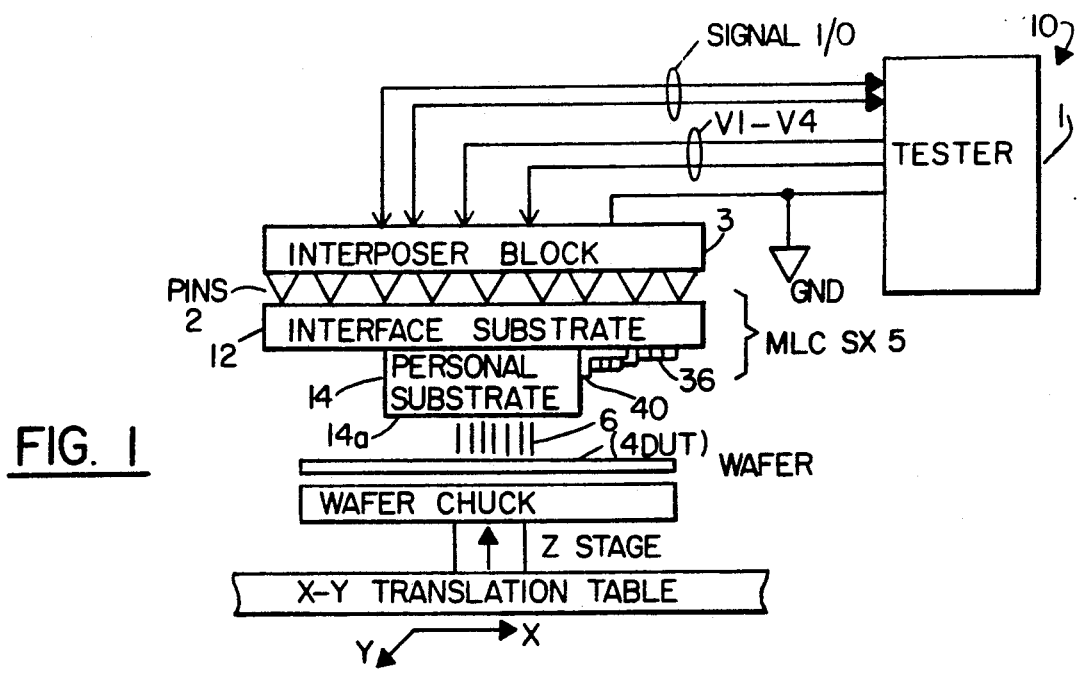
FIG. 1 is a simplified side view of a MLC SX, constructed in accordance with the invention, and showing the coupling of the MLC SX to a tester and a device test.

As seen in FIG. 1 a test system 10 includes a tester 1 that is coupled via an interposer block 3 to a plurality of test pins 2 ("pogo pins") and, through a MLC SX 5 and probes 6, to a DUT 4. The DUT 4 is typically contained within an integrated circuit wafer 3. During a test an x-y stage positions a z-axis stage to compress the DUT 4 against the probes 6. The MLC SX 5 is comprised of an interface substrate 12 and a personalization substrate 14. The personalization substrate 14 has a plurality of electrical conductors disposed upon a top surface 14a in an array that corresponds to test the electrical terminals of the DUT 4 are compressibly urged against the probes 6 and through the probes 6 to the array of conductors on the top surface 14a.

It should be noted that reference is made herein to top and bottom surfaces of the various substrates 12 and 14. However, the directional references should not be construed in an absolute sense but only as an orientation that corresponds to a convention wherein the surface 14a is considered to be a "top" surface of the personalization module 14. All other surface designations are correspondingly referenced to the top surface 14a of the personalization module 14.

The following commonly assigned U.S. Patents all teach various aspects of MLC structure and fabrication techniques: U.S. Pat. No. 4,896,464, Jan. 30, 1990, "Formation of Metallic Interconnects by Grit Blasting", J. Kim et al., U.S. Pat. No. 4,349,862, Sept. 14, 1982, entitled "Capacitive Chip Carrier and Multilayer Ceramic Capacitors" C. H. Bajorek et al., U.S. Pat. No. 4,328,530, May 4, 1982, entitled "Multiple Layer, Ceramic Carrier for High Switching Speed VLSI Chips" by C. H. Bajorek et al., and U.S. Pat. No. 4,221,047, Sept. 9, 1980, entitled "Multilayered Glass-Ceramic Substrate for Mounting of Semiconductor Device" by B. Narken et al.

In general a MLC substrate, such as the substrates 12 and 14 of FIG. 1, is a laminated structure comprised of a plurality of layers of ceramic material. The individual layers are laminated together and subsequently fired to sinter the layers into a unitary ceramic module. Upon a top surface of the module are provided pads for coupling to corresponding I/0 and power pads of an integrated circuit device, such as the DUT 4. The opposite, bottom surface of the module is provided with a plurality of pads for coupling to I/0 signal lines.

Typically, each of the layers is first provided in a "greensheet" form, that is, as an unfired polymer binder which may have a quantity of ground glass material distributed throughout. Holes are made through the layers, typically by a punching process; each hole defining the desired location of a conductive signal or power line via. The holes are thereafter filled with a paste which comprises conductive metal particles, such as molybdenum. Conductive pathways may also be formed between certain of the vias by applying the metallic paste to a layer by well known screening operations. A plurality of patterned greensheets are thereafter laminated together to form a multilayered structure. Some of the vias of adjacent greensheet layers are formed in registration with one another for producing continuous vias which extend from one layer to an adjacent and/or a non-adjacent layer.

After forming the multilayer structure in the manner described above the structure is baked at a high temperature such that the laminated greensheet layers are sintered into a multilayered ceramic module. During this baking process the metal paste is cured and solid metallic interconnections are formed through the via holes and between selected vias.

The primary purpose of the interface substrate 12 is to provide a fixed interface between the tester 1 and the personalization substrate 14. On the bottom surface of the interface substrate 12 is an array of contacts intended for coupling to the corresponding array of tester pins 2. I/O signals are routed from their respective bottom-side contacts up to a corresponding top-side matrix location. In addition, tester power pins ($V_1$-$V_4$) contact power pads provided on the bottom side of the interface substrate 12, the power pads being coupled to vias that bring up various voltages to respective voltage distribution planes within the interface substrate 12. Power is also distributed by vias from the power plane layers up to the top surface of the interface substrate 12 where the power-carrying vias are terminated in metalized strips 20, as seen in FIG. 5. The interface substrate 12 typically contains from 30 to 40 individual layers, has a thickness of approximately 150 mils and is approximately five inches square.

The personalization substrate 14 provides for a fanout of the I/0 signals conveyed from the interface substrate 12, and also the power conveyed through the substrate 14 sidewall, into the "footprint" of the specific DUT 4 chip type or family being tested. The personalization substrate 14 and the interface substrate 12 are each provided with an array of signal pads on their respective bottom and top surfaces. The two substrates are conductively and physically coupled together by a C-4 technique wherein small solder balls are placed on the array of signal pads, the solder balls then being heated and reflowed. In that the two substrates 12 and 14 are comprised of the same materials their coefficients of thermal expansion are substantially equal, thereby avoiding thermal-related stresses during fabrication and subsequent use. The opposing arrays of pads are provided, in a presently preferred embodiment, as a 41X41 array of 250 micron pads on 600 micron centers. The personalization substrate 14 typically contains 50 individual layers, has a thickness of approximately 250 mils, and is approximately 1.25 inches square. The individual layers include power plane layers and signal distribution layers.

The tester 1 power supply provides, by example, four voltages ($V_1$-$V_4$), corresponding voltage sense connections, and a ground (GND). For each of the voltages up to four power plane layers 16 are provided, the power planes associated with a particular voltage are conductively coupled together by vias 27, as will be described. As used herein the electrical conductors coupled to $V_1$-$V_4$ and GND are all considered to be DUT 4 power supplying conductors.

In accordance with the invention power to the DUT 4 is fed from the metalization lines 20 to the side surfaces of the personalization substrate 14. Further connections are made from the side surfaces of the personalization substrate 14 to the internal power planes and, from the internal power planes, through vias to the top surface 14a of the module 14.

Although the presently preferred embodiment routes power through the personalization substrate 14 sidewalls, a number of other techniques may be employed for routing power to and providing capacitive decoupling for the stacked substrate MLC SX 5. However, for the reasons discussed below it can be seen that the presently preferred embodiment overcomes a number of problems associated with each of these other power routing, and associated decoupling capacitor placement, techniques.

A first approach utilizes the bottom surface of the interface substrate 12 for capacitor mounting. Mounting on the bottom of the interface substrate 12 is achieved by routing the power vias to a bottom surface termination pad on which the capacitor is placed. An array of capacitor pads is thus required to populate the bottom surface of the interface substrate 12. However, such an array of pads occupies a significant amount of surface area and reduces the available area that may be allocated to signal I/O connections from the tester 1. To compensate for the reduction in area the size of the interface substrate may be increased, but at a cost of also increasing the DC resistance of the signal lines. The complexity of I/0 signal fanout is also increased by the presence of the decoupling pads.

A further disadvantage of interface substrate bottom surface decoupling is that the total inductance of the electrical path from the probe connection point to the capacitor placement point is significant. The total inductance becomes the summation of the inductance of the full via length of the personalization substrate 14 plus the inductance of the vias traveling through the thickness of the interface substrate 12.

A second approach to decoupling capacitor placement is to mount decoupling capacitors at the top surface of the personalization substrate 14. This is accomplished by extending vias up from the various internal voltage distribution planes to connecting pads on the personalization substrate 14 top surface.

Disadvantages to this approach include the following. Physical size constraints limit the total number of capacitors that can be placed on the top surface of the personalization substrate. Also, a via structure must be employed to route the appropriate voltages to the top surface of the personalization substrate. The added inductance of these vias decreases the effectiveness of the decoupling capacitors.

A third approach to mounting the decoupling capacitors is to place the capacitors on the top surface of the interface substrate 12. Power vias are extended down through the entire personalization substrate 14 and into the underlying interface substrate 12. Within the interface substrate 12 the vias continue downward to the various internally disposed voltage distribution planes. Vias are also brought up from the interface substrate 12 voltage distribution planes to pads on the top surface of the interface substrate 12 for connection to the associated decoupling capacitor. However, this power routing scheme also introduces a significant amount of inductance due to the relatively long power via lengths.

The presently preferred technique for routing power to the DUT 4, and for providing an optimal placement of decoupling capacitors, is now described in greater detail. The ensuing description is made in the context of the stacked substrate MLC SX 5. This approach is useful for several reasons including ease of manufacturability, low cost and the provision of a generic interface to any tester. It should be realized however that the teaching of the invention is not intended to be limited for use only with a stacked substrate MLC SX embodiment.

Figure 2:
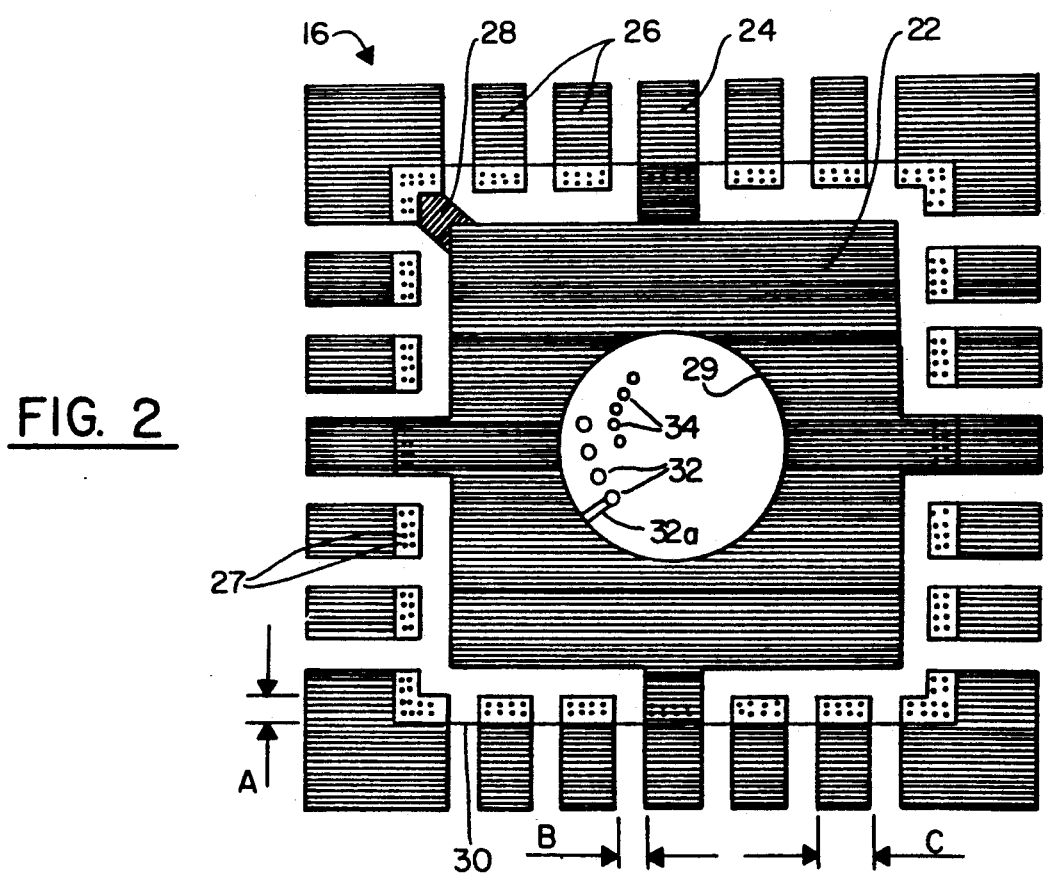
FIG. 2 is a top view of a single power plane layer of the personalization substrate prior to completion of fabrication of the personalization substrate.

Referring to FIG. 2 the preferred power distribution technique is accomplished by fabricating the personalization substrate 14 such that on a layer 16 having a power plane 22 the plane 22 is provided with extensions 24 that extend beyond a desired post-firing physical dimension. In FIG. 2 the desired post-firing dimension is indicated by the dotted line 30. Redundant pads 26 are also placed on the layer 16 to increase the surface area of each of the side mount contacts. The extensions 24 and the redundant pads 26 are provided with a plurality of vias 27 for conductively coupling to overlying and underlying power planes within the personalization layer 14. For those conductive pads 26 that are required to also electrically contact the power plane 22 the layer 16 is formed with heavy traces or jumpers 28 for coupling the associated pad or pads 26 to the plane 22.

Figure 3:
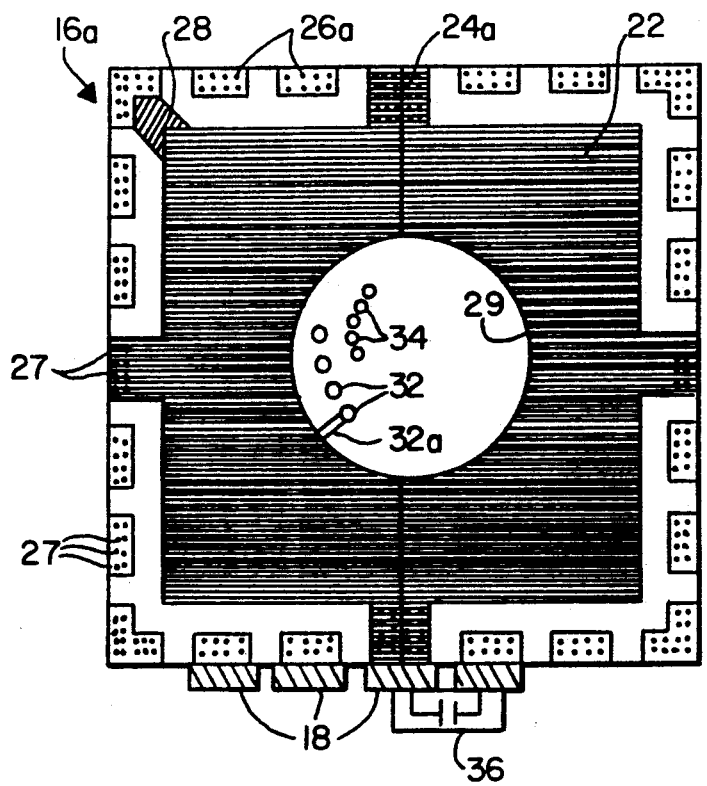
FIG. 3 is a top view of the single layer of FIG. 2 after fabrication, showing the coupling an internal power sidewall electrical contacts.

After sintering the personalization substrate 14 is cut to the specified physical size, as depicted in FIG. 3. In that the power plane extensions 24 and the pads 26 extend past the cutting dimension, the edge of the associated metalization 24a and 26a is exposed along the substrate sidewalls in the plane of the cutting.

In FIG. 2 the power plane 22 electrical conductor is preferably fabricated as a mesh structure, as opposed to a continuous metalization layer, in order to enhance the adhesion of adjacent ceramic layers one to another and to minimize an inductance of the conductor. A metallic mesh having 50% surface coverage and a thickness of approximately two to three mils has been found to provide sufficient electrical current carrying capability while also providing for sufficient between-layer fusion to prevent subsequent delamination of the personalization substrate 14. The same criteria is also applied to the fabrication of the interface substrate 12. On the top and bottom surfaces of the substrates 12 and 14, where contact with an adjacent ceramic layer is not required, the mesh structure is also not required and the metalization can be fabricated, if desired, as a continuous plane. A centrally disposed opening 29 within the power plane mesh provides a clear area, or conduit, for the routing of power and signal line vias, only a small number of which are shown as the vias 32 and 34, respectively, vertically up through the substrates 12 and 14. For the power vias 32 that convey the voltage associated with the plane 16 conductive traces 32a are employed to contact the power plane mesh. The opening 29 has a dimension sufficient to accommodate the DUT 4 footprint.

In FIG. 2 the dimensions a and B are each approximately 0.05 inches and the dimension C is approximately 0.1 inches.

Within a given one of the substrates 12 or 14 a layer having signal line traces and interconnects is preferably interposed between two power plane ground layers to provide a transmission strip-line characteristic.

As can be seen in FIG. 3 the conductive pads 18, preferably comprised of gold or a similar conductive metal, are formed by known thick film layer techniques upon the personalizaton substrate 14 sidewalls, thereby terminating the exposed edges of the sidewall metalization 24a and 26a. The pads 18 are each approximately two mm in width and have a thickness of approximately 1000 Angstroms. Power is coupled in from selected ones of the pads 18 to the power plane layer 16, from where the power is distributed to all associated DUT 4 power vias 32 within the DUT footprint area. The vias 32 are brought up to the top surface of the personalization substrate 14 for contacting the associated power terminals of the DUT 4.

In accordance with an aspect of the invention the inductance of the DUT 4 power feed structure is minimized by the sidewall coupling which also permits the placement of decoupling capacitors 36 at an optimum position relative to the metalized pads 18. The capacitors 36 are preferably small ceramic thick-film devices having electrical terminals 38 that are conductively coupled to the metalization by a silver epoxy or similar conductive medium.

As can be seen in greater detail in FIG. 5 the side contacts 18 are conductively coupled to the power strips 20 by small L-shaped conductive members 40, the connection being made preferably by a soldering operation. Each arm of a conductive member 40 has a typical length of approximately 100 mils. Each capacitor 36 is approximately 60 mils wide, 100 mils in length and 40 mils thick. The spacing between conductors 20 is such that two capacitors 36 are butted end to end upon a single conductor 20, with each capacitor extending to approximately a center of an adjacently disposed conductor 20. The value of the capacitors is selected to optimize the decoupling of power supply switching transients. A typical value for each of the capacitors 36 is one microfarad. In a presently preferred embodiment the capacitors 36 are vertically stacked three high by eleven positions deep to provide for 33 capacitors, or 33 microfarads of decoupling capacitance, at each of the sidewall power feed locations. Of course, more or less than this number of capacitors 36 can be employed, depending on the value of each capacitor, the expected current flow through the associated sidewall contact, and other related factors.

Figure 4:
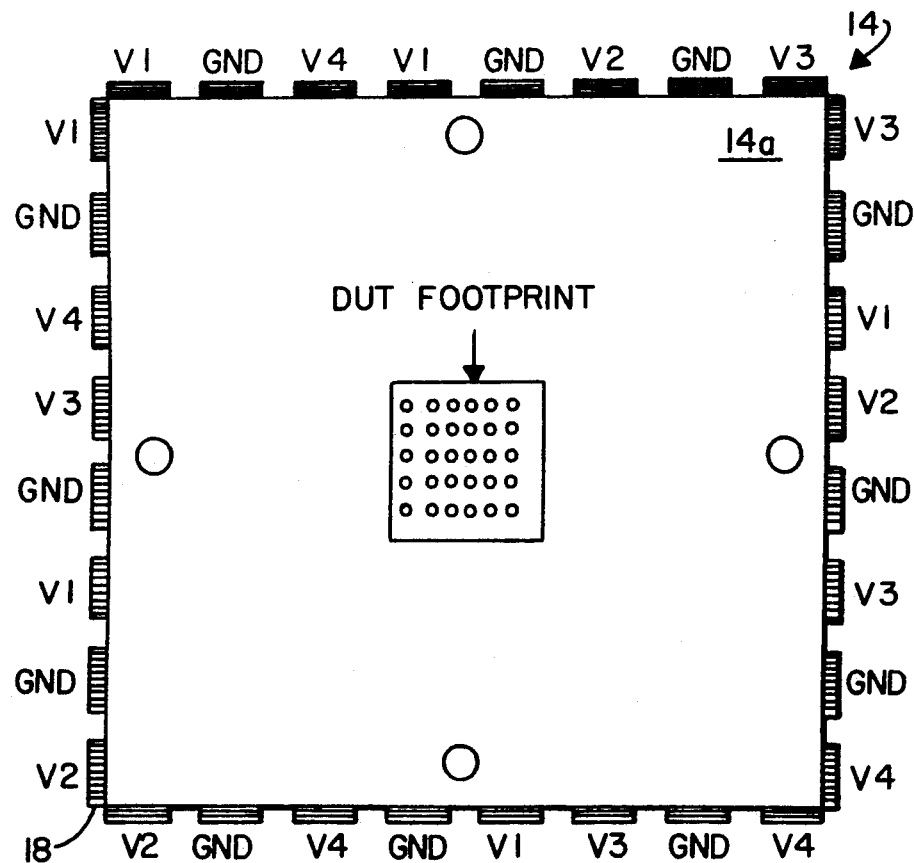
FIG. 4 is a top view of a presently preferred embodiment of the personalization substrate showing voltage assignments for the sidewall electrical contacts.

FIG. 4 illustrates a top view of the personalization substrate 14 and illustrates a presently preferred configuration having eight conductive pads per side. A presently preferred voltage distribution is also shown for a four voltage ($V_1$-$V_4$) and one ground (GND) tester configuration. In that multiple pads are assigned per voltage the equivalent inductance of the decoupling network is reduced due to the paralleling of the individual pad inductances. Furthermore, in that an equivalent inductance of the power plane 22 is calculated as a summation of parallel inductors that make up the mesh power plane 22, the mesh plane has a low inductance as compared to via-only power feed structures, wherein the equivalent inductance is instead a series, additive inductance.

The specific voltage assignment for the 32 pads is made according to an anticipated Delta-I of each of the various power supplies. Of course, more or less than eight pads per side can be employed depending on the number of power supplies, the anticipated current densities during test, and other factors.

A concern that arises regarding DUT powering is the relatively heavy DC currents required. For example, it is not uncommon for DUT DC currents to reach 10A. A considerable amount of power can thus be dissipated in the feed structure. As a result, the resistance of all of the portions of the power supply feed structure must be carefully considered.

Two separate portions of the feed structure are now examined, the DC resistance of the mesh power plane 22 and the contact resistance of the side pad or pads 18 to the mesh power plane 22. Resistance can be calculated as:

$$R = p_s L/W$$

where $p_s$ is the sheet resistivity of the conductor, L is the length of the conductor and W is the width of the conductor.

The DC resistance of the mesh itself, due to the nature of the feed structure, becomes very small. A typical width of the metal mesh is 100 mils per side connection. With a 50% metal mesh, the effective metal used for the connection is 50 mils. The length of the mesh, from the plane to substrate edge, is 100 mils. Given that $p_s$ is equal to approximately five milliohms per square area, which is a value typical of most Au or Ag metal systems, the calculated DC resistance of the mesh is only:

$$R_{mesh} = (5 \times 10^{-3})(0.1)/0.05 = 10 \text{ milliohms}.$$

Also, the multiple mesh connections per voltage further reduces the total resistance. Thus, the mesh DC resistance is sufficiently low to accommodate the significant DC current required by the DUT 4.

To maximize an amount of sidewall connection area between the plane 22 and the pads 18 the redundant smaller mesh planes 26a are employed on each of the power and GND planes. The small planes 26a are connected to the metal mesh plane within another power plane layer with four mil diameter vias 27. Two rows of four vias each are used for the connection. Using this redundant scheme, the connection to the side pads 18 is made with adequate surface area to accommodate the required DC currents. Also, the effective surface area of each sidewall connection is increased by the use of the redundant pads 26a on other layers, above and below the particular distribution plane. The vias 27 are used to connect the redundant pads 26a from other layers to the voltage distribution plane 22. Thus, the DC current can be accommodated without increasing the AC inductance of the structure.

In summary, the teaching of the invention provides apparatus for coupling at least operating power to an integrated circuit device during a test of the device. The apparatus includes terminals for connecting operating power to electrical contacts disposed upon a first surface of a first MLC substrate and vias for routing the operating power up through the first MLC substrate to a plurality of first electrical conductors disposed upon a second surface of the first MLC substrate. The apparatus also includes conductors for coupling the operating power from the first electrical conductors to a plurality of power distribution planes disposed within a second MLC substrate that is mounted upon the second surface of the first MLC substrate. The couplers include structure for contacting edges of the power distribution planes that are exposed in cross-section upon sidewalls of the second MLC substrate. The apparatus further includes further vias for routing the operating power up through the second MLC substrate to a plurality of second electrical conductors disposed upon a second surface of the second MLC substrate. The second electrical conductors are coupled, during use, to electrical power terminals on the integrated circuit device under test.

Further in accordance with the invention the apparatus provides capacitors for decoupling electrical transients occurring in the operating power, the capacitors being disposed substantially adjacent to the sidewalls of the second MLC substrate.

The invention also teaches a method of coupling operating power to an integrated circuit device during a test of the device. The method includes the steps of (a) connecting operating power to electrical contacts disposed upon a first surface of a first MLC substrate; (b) routing the operating power up through the first MLC substrate to a a plurality of first electrical conductors disposed upon a second surface of the first MLC substrate; and (c) coupling the operating power from the first electrical conductors to a plurality of power distribution planes disposed within a second MLC substrate that is mounted upon the second surface of the first MLC substrate. The step of coupling includes a step of contacting edges of the power distribution planes that are exposed in cross-section upon sidewalls of the second MLC substrate. The method includes an additional step of routing the operating power up through the second MLC substrate to a plurality of second electrical conductors disposed upon a second surface of the second MLC substrate. The second electrical conductors are coupled, during use, to electrical power terminals on the integrated circuit device being tested.

A further step of the method decouples electrical transients occurring in the operating power, the step of decoupling occurring substantially adjacent to the sidewalls of the second MLC substrate.

Thus, while the invention has been particularly shown and described with respect to a preferred embodiment thereof, it will be understood by those skilled in the art that changes in form and details may be made therein without departing from the scope and spirit of the invention.

Having thus described out invention, what we claim as new, and desire to secure by Letters Patent is:

1. Apparatus for coupling operating power to an integrated circuit device during a test of the device, comprising:

means for connecting operating power to electrical contacts disposed upon a first surface of a first MLC substrate;

means for routing the operating power through the first MLC substrate to a plurality of first electrical conductors disposed upon a second surface of the first MLC substrate;

means for coupling the operating power from the first electrical conductors to a plurality of power distribution planes disposed within a second MLC substrate that is mounted upon the second surface of the first MLC substrate, the coupling means including means for contacting edges of the power distribution planes that are exposed in cross-section upon sidewalls of the second MLC substrate, the second MLC substrate being mounted on the first MLC substrate in such a manner that the second surface of the first MLC substrate at least partially surrounds the second MLC substrate; and means for routing the operating power through the second MLC substrate to a plurality of second electrical conductors disposed upon a second surface of the second MLC substrate, the second electrical conductors being coupled, during use, to electrical power terminals on the integrated circuit device being tested.

2. Apparatus as set forth in claim 1 and further comprising means for decoupling electrical transients occurring in the operating power, the decoupling means being disposed substantially adjacent to the sidewalls of the second MLC substrate.

3. Apparatus as set forth in claim 1 wherein the contacting means is comprised of a plurality of L-shaped members individual ones of which are electrically coupled to one of the first electrical conductors and also to a plurality of the power distribution planes.

4. An integrated circuit test structure comprising:
a body having a first portion and a second portion, the first portion having a first surface area that is larger than an area of a second surface of the second portion such that a portion of the first surface of the first portion surrounds the second portion, a first surface of the second portion including means for connecting at least operating power to an integrated circuit that is disposed, during the test thereof, in proximity to the first surface of the second portion;

the second portion being comprised of a plurality of horizontally disposed electrically insulating layers, certain of the layers having an electrically conductive pattern disposed thereon, each pattern having one or more regions exposed in cross-section upon sidewalls of the second portion, the conductive patterns being electrically coupled through the second portion to the first surface connecting means;

a plurality of electrical conductors disposed upon the first surface of the first portion in proximity to the second portion, the electrical conductors being coupled during use to the operating power; and a plurality of conductive members individual ones of which are electrically coupled to one of the electrical conductors disposed upon the first surface of the first portion and to a plurality of the regions exposed in cross-section upon a sidewall of the second portion.

5. An integrated circuit test structure as set forth in claim 4 and further comprising at least one decoupling capacitor means disposed upon the first surface of the first portion and electrically coupled to one or more of the patterns through an associated one of the conductive members.

6. An integrated circuit test structure as set forth in claim 4 wherein individual ones of the regions of each of the certain layers are disposed in vertical registration with individual ones of the regions of others of the certain layers and further comprising means, disposed upon the sidewalls of the second portion, for conductively coupling together those regions disposed in vertical registration one with another.

7. An integrated circuit test structure as set forth in claim 4 wherein the second portion is comprised of a multilayer ceramic substrate.

8. An integrated circuit test structure as set forth in claim 7 wherein the first portion is comprised of a multilayer ceramic substrate having a plurality of electrical conductors on a second surface thereof for coupling to an integrated circuit test system, including an integrated circuit test system power supply, and wherein the first portion further includes a plurality of internally disposed electrical conductors that extend from the electrical conductors on the second surface to the electrical conductors disposed upon the first surface of the first portion.

9. An integrated circuit test structure as set forth in claim 4 wherein each of the conductive members is comprised of an L-shaped electrical conductor.

10. An integrated circuit test structure as set forth in claim 4 wherein the electrically conductive pattern of each of certain layers is coupled to at least one other electrically conductive pattern of another one of the certain layers by a plurality of conductive vias that extend vertically through the layers of the second portion.

11. An integrated circuit test structure as set forth in claim 4 wherein the electrically conductive pattern of each of certain layers is comprised of a metallic mesh structure.

12. An integrated circuit test structure as set forth in claim 4 wherein the electrically conductive pattern of each of certain layers has an open region formed therein, wherein each open region is disposed in registration with the open regions of others of the certain layers, and wherein a plurality of vias extend vertically through the layers of the second portion, within the open regions, to the first surface of the second portion.

13. An integrated circuit test structure comprising:
a first MLC substrate and a second MLC substrate that is disposed upon a first surface of the first MLC substrate, the first MLC substrate having a first surface area that is larger than an area of a second surface of the second MLC substrate such that a portion of the first surface of the first MLC substrate surrounds the second MLC substrate, a first surface of the second MLC substrate including means for connecting at least operating power to an integrated circuit that is disposed, during the test thereof, in proximity to the first surface of the second MLC substrate;

the second MLC substrate including power distribution layers having a plurality of electrically conductive patterns disposed thereon, each pattern having one or more regions exposed in cross-section upon sidewalls of the second MLC substrate, the conductive patterns being electrically coupled by vias that extend vertically upwards through the second MLC substrate to the first surface connecting means;

a plurality of elongated electrical conductors disposed upon the first surface of the first MLC substrate in proximity to the second MLC substrate, the electrical conductors being coupled during use to operating power;

a plurality of conductive members individual ones of which are electrically coupled to one of the electrical conductors disposed upon the first surface of the first MLC substrate and to a plurality of the regions exposed in cross-section upon a sidewall of the second MLC substrate; and a plurality of decoupling capacitors disposed upon the first surface of the first MLC substrate and electrically coupled to one or more of the patterns through an associated one of the conductive members.

14. An integrated circuit test structure as set forth in claim 13 wherein individual ones of the regions of a given layer are disposed in vertical registration with individual ones of the regions of others of the layers, and further comprising a plurality of electrically conductive layers vertically disposed upon the sidewalls of the second MLC substrate individual ones of which conductively couple together those regions disposed in vertical registration one with another.

15. An integrated circuit test structure as set forth in claim 13 wherein the first MLC substrate has an array of electrical conductors disposed on a second surface thereof for coupling to an integrated circuit test system, including an integrated circuit test system power supply, and wherein the first MLC substrate further includes a plurality of internally disposed vias that extend from the electrical conductors on the second surface to the elongated electrical conductors disposed upon the first surface of the first MLC substrate.

16. An integrated circuit test structure as set forth in claim 13 wherein each of the conductive members is comprised of an L-shaped electrical conductor.

17. An integrated circuit test structure as set forth in claim 13 wherein the electrically conductive patterns are comprised of a metallic mesh structure.

18. A method of coupling operating power to an integrated circuit device during a test of the device, comprising the steps of:

connecting operating power to electrical contacts disposed upon a first surface of a first MLC substrate;

routing the operating power through the first MLC substrate to a plurality of first electrical conductors disposed upon a second surface of the first MLC substrate;

coupling the operating power form the first electrical conductors to a plurality of power distribution planes disposed within a second MLC substrate that is mounted upon the second surface of the first MLC substrate, the second MLC substrate being mounted on the first MLC substrate in such a manner that the second surface of the first MLC substrate at least partially surrounds the second MLC substrate, the step of coupling including a step of contacting edges of the power distribution planes that are exposed in cross-section upon sidewalls of the second MLC substrate; and routing the operating power through the second MLC substrate to a plurality of second electrical conductors disposed upon a second surface of the second MLC substrate, the second electrical conductors being coupled, during use, to electrical power terminals on the integrated circuit device being tested.

19. A method as set forth in claim 18 and further comprising a step of decoupling electrical transients occurring in the operating power, the step of decoupling occurring substantially adjacent to the sidewalls of the second MLC substrate.

20. A method as set forth in claim 18 wherein the step of coupling includes the steps of:

coupling an individual one of a plurality of electrically conductive members between each of the first conductors and one of the edge or edges of the power distribution planes that are exposed in cross-section upon the sidewalks of the second MLC substrate; and coupling at least one capacitance between two adjacent ones of the first conductors, the at least one capacitance being coupled to the two adjacent ones of the first conductors in proximity to a sidewall of the second MLC substrate.

* * * * *